United States Patent
Manouvrier

(10) Patent No.: US 9,430,592 B2
(45) Date of Patent: Aug. 30, 2016

(54) METHOD FOR SIMULATING THE ELECTRICAL BEHAVIOUR OF AN INTEGRATED DIODE AND CORRESPONDING COMPUTERIZED SYSTEM

(71) Applicant: STMicroeletronics SA, Montrouge (FR)

(72) Inventor: Jean-Robert Manouvrier, Saint Martin d'héres (FR)

(73) Assignee: STMicroelectronics SA, Montrouge (FR)

( * ) Notice: Subject to any disclaimer, the term of this patent is extended or adjusted under 35 U.S.C. 154(b) by 944 days.

(21) Appl. No.: 13/689,997

(22) Filed: Nov. 30, 2012

(65) Prior Publication Data

US 2013/0151224 A1 Jun. 13, 2013

(30) Foreign Application Priority Data

Dec. 7, 2011 (FR) ...................................... 11 61275

(51) Int. Cl.
*G06F 17/50* (2006.01)
*G06G 7/62* (2006.01)

(52) U.S. Cl.
CPC ....... *G06F 17/5009* (2013.01); *G06F 17/5036* (2013.01)

(58) Field of Classification Search
CPC .................. G06F 17/5009; G06F 17/5036
USPC ........................................................ 703/13
See application file for complete search history.

(56) References Cited

U.S. PATENT DOCUMENTS

2007/0058308 A1* 3/2007 Thijs ...................... H03F 1/223
361/56

OTHER PUBLICATIONS

Nawby et al. "Physically based compact device models for circuit modelling applications". Elsevier. 2001. 15 Pages.*
Sarro et al. "A Scalable SCR Compact Model for ESD Circuit Simulation". IEEE 2010. p. 3275-3286.*
Romanescu et al. "A Novel Physical Model for the SCR ESD Protection Device". 2010 IEEE. 10 Pages.*
Manouvrier, J-R., et al., "Characterization of the Transient Behavior of Gated/STI Diodes and their Associated BJT in the CDM Time Domain," 29th Electrical Overstress/Electrostatic Discharge Symposium, Sep. 16-21, 2007, 3A.2.1-3A.2-10, IEEE.
Manouvrier, J-R., "Comportement des diodes de protection lors d' événements trasitories rapides dus aux ESD: outils de caractérisation, physique du semi-conducteur et modélisation," Universite Montpellier II Sciences et Techniques du Languedoc, Jul. 2, 2008, 166 pages. (Translation to Follow).
Manouvrier, J-R., et al., "A Physics-Based Compact Model for ESD Protection Diodes under Very Fast Transients," Electrical Overstress/Electrostatic Discharge Symposium, Sep. 7-11, 2008, pp. 67-75, IEEE.
Maxim, A., et al.,"A Novel Power PIN Diode Behavioral SPICE Macromodel Including the Forward and Reverse Recoveries and the Self-Heating Process," International Symposium on Circuits and Systems ISCAS '99, Jul. 1999, vol. 6, pp. 278-281, IEEE.

* cited by examiner

*Primary Examiner* — Eunhee Kim
(74) *Attorney, Agent, or Firm* — Slater Matsil, LLP

(57) ABSTRACT

A method for simulating, in an electrical device simulator, electrical behavior of an integrated diode is described. The diode is modelled using a compact model in the electrical device simulator to determine the electrical behavior of the diode in a given situation. The modelling includes modelling a series resistance relating to the active regions and to the connections, modelling a PN junction of the diode, and modelling a well resistance for positive values of a current passing through the diode involving a conductivity modulation model. The method further includes modelling of the well resistance for negative values of the current by a curve which increases steeply from an initial resistance value corresponding to a zero value of current up to a plateau.

20 Claims, 7 Drawing Sheets

METHOD FOR SIMULATING THE ELECTRICAL BEHAVIOUR OF AN INTEGRATED DIODE AND CORRESPONDING COMPUTERIZED SYSTEM

This application claims the benefit of French Application No. 1161275, filed on Dec. 7, 2011, entitled "Method for Simulating the Electrical Behavior of an Integrated Diode and Corresponding Computerized System," which application is incorporated herein by reference.

TECHNICAL FIELD

The invention relates to the simulation of the electrical behavior of integrated devices, for example integrated on silicon, by using a compact modelling of these devices, and in particular the compact models of on-silicon integrated diodes.

The invention applies most particularly, but not exclusively, to the compact modelling of integrated diodes so as to predict their behavior in the presence of electrostatic discharges (ESD).

BACKGROUND

In the field of microelectronics, an electrostatic discharge can occur throughout the life of an integrated circuit, and constitutes a genuine problem for the reliability of this integrated circuit and also a major cause of failure.

SUMMARY OF THE INVENTION

In one aspect, embodiments of the presented principles provide for simulating, in an electrical device simulator, electrical behavior of an integrated diode in a given situation, the said diode comprising, within a well having a first type of conductivity, a first active region having a second type of conductivity opposite from the first type and at least one second active region having the first type of conductivity, the active regions forming an anode and a cathode of the diode, and further comprising connections on the active regions. The method comprises modelling a compact model of the diode in an electrical device simulator to determine the electrical behavior of the diode in the given situation. The modelling further comprises modelling a series resistance relating to the active regions and to the said connections, modelling a PN junction of the diode, modelling a well resistance for positive values of a current passing through the diode involving a conductivity modulation model, and modelling of the well resistance for negative values of the said current by a curve which increases steeply from an initial resistance value corresponding to a zero value of current up to a plateau.

In another aspect, embodiments of the presented principles provide for simulating electrical behavior of a diode by an electrical device simulator. The method comprises receiving parameters describing physical characteristics of the diode, where the diode comprises at least a well having a first type of conductivity, a first active region having a second type of conductivity opposite from the first type and at least one second active region having the first type of conductivity. The first region and the second active region form an anode and a cathode of the diode. The method further comprises modelling a compact model of the diode in an electrical device simulator based on the received parameters, modelling a series resistance relating to the active regions and to a connection on the first active region and a connection on the second active region, modelling a PN junction of the diode, modelling a well resistance for positive values of a current passing through the diode using a conductivity modulation model, and modelling the well resistance for negative values of the said current by a curve which increases steeply from an initial resistance value corresponding to a zero value of current up to a plateau.

In another aspect, embodiments of the presented principles provide for a software system embodied on a tangible and non-transitory computer readable medium having instructions for simulating electrical behavior of a diode. The system comprises instructions for executing steps comprising receiving parameters describing physical characteristics of the diode, the diode comprising at least a well having a first type of conductivity. The instructions further comprise modelling, based on the received parameters, a series resistance relating to at least a first active region having a second type of conductivity and at least one second active region having a first type of conductivity opposite the second type of conductivity, modelling, based on the received parameters, a PN junction of the diode, modelling a well resistance for positive values of a current passing through the diode using a conductivity modulation model, and modelling the well resistance for negative values of the said current by a curve increasing from an initial resistance value corresponding to a zero value of current up to a plateau.

BRIEF DESCRIPTION OF THE DRAWINGS

Other advantages and characteristics of the invention will become apparent on examining the detailed description of wholly non-limiting modes of implementation and of embodiment, and the appended drawings in which.

DETAILED DESCRIPTION OF ILLUSTRATIVE EMBODIMENTS

Figure 1:
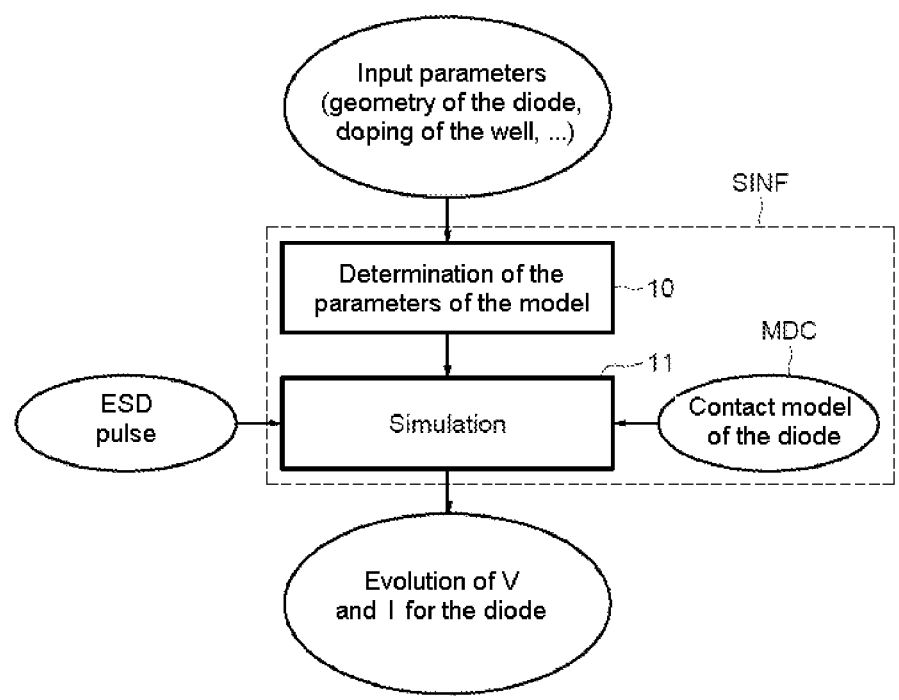
FIG. 1 illustrates very schematically the main steps of a mode of implementation of a method according to the invention.

Before addressing the illustrated embodiments in detail, various embodiments and advantageous features are discussed generally in the following paragraphs.

In order to define ESD robustness of an integrated circuit in relation to electrostatic discharges, it is possible to perform various tests which obey different models.

It is especially possible to cite the tests termed HBM ("Human Body Model"), MM ("Machine Model"), and CDM ("Charged Device Model").

The HBM test corresponds to the discharge current generated by a person who touches an earthed component with the tip of their finger. The electrical circuit making it possible to simulate this type of discharge conventionally comprises a capacitor, typically of 100 picofarads, in series with a resistor typically of 1500 ohms, the circuit being connected to the component under test. The capacitor is then charged to a voltage of the order of a few kilovolts.

The corresponding ESD pulse corresponds to a current pulse whose mean duration is 300 nanoseconds with a current spike varying between 1 and 3 amperes as a function of the value of the precharge voltage.

The MM model corresponds to an ESD discharge that would be produced by a machine touching the component or a person handling a metallic tool touching the component. The MM model is substantially the same as the HBM model but with different capacitor and resistor values.

The CDM model differs from the HBM and MM models and makes it possible to simulate a charged component which discharges through at least one of its pins contacting for example an earth plane. Such an ESD discharge then arises as a current pulse of large amplitude (typically 15 amperes) for an extremely short duration, typically a nanosecond.

The elements of an integrated circuit which are particularly sensitive to ESD pulses of the HBM or MM type are especially the input/output ports and the circuitry at the periphery of the integrated circuit.

On the other hand, the charges resulting from an ESD pulse of the CDM type do not necessarily follow the input/output paths in order to escape but may follow any path inside the component in order to escape to a single contact point.

An ESD protection structure is a structure, connected for example to the inputs/outputs of the circuit, intended to convey the discharge current without degradation in the functional part of the integrated circuit. The ESD structure is therefore aimed at preventing the discharge current from penetrating into the core of the circuit while limiting the voltage across its terminals.

Diodes are components commonly used within the framework of ESD protection.

In order to aid the designers of integrated circuits to better optimize circuits for protecting against electrostatic discharges, in particular of CDM type, it is necessary to predict the transient behavior of the protection structures, late triggering of which may possibly generate overvoltages that might degrade the circuit to be protected.

In this context, it is particularly advantageous to have models making it possible to faithfully retranscribe the behavior of the protection structures, in particular of the diodes, during very fast transient events, such as ESD events.

Although compact models of diodes already exist, they merely model its behavior under DC current (DC behavior) in a zone of low to medium injection and merely add a capacitive behavior.

Such models do not make it possible to respond to the specific problems raised by ESD components, which are subject to very fast transient events and to high levels of current.

It is recalled here that the notion of a compact model, well known to the person skilled in the art, pertains to a model based on analytical expressions, generally a limited number of them, these models being used with conventional simulators, for example simulators known for example by the names ELDO, SPECTRE, SPICE, and marketed by the companies CADENCE or MENTOR.

A compact model is thus distinguished especially from a so-called "TCAD" simulation which generally uses finite element modelling, which is extremely expensive in terms of calculation time.

The physical behaviors of protection diodes during fast transient events due to electrostatic discharges have been highlighted, especially in the thesis by Jean-Robert Manouvrier entitled "Comportement des diodes de protection lors d'évènements transitoires rapides dues aux ESD: outils de caractérisation, physique du semiconducteur et modélisation" [Behavior of protection diodes during fast transient events due to ESDs: characterization tools, semiconductor physics and modelling] (Université Montpellier II, Sciences et Techniques du Languedoc, July 2008), and in the article by Jean-Robert Manouvrier and others entitled "Characterization of the Transient Behavior of Gated/STI Diodes and their Associated BJT in the CDM Time Domain", EOS/ESD SYMPOSIUM 07-165.

More particularly, in the strong injection regime, the concentration of the majority carriers can become higher than the concentration of dopants, so as to neutralize the diffusion charge of the minority carriers. This causes modulation of the conductivity and therefore of the resistance of the well.

Thus, during the transient characterization of the diodes over time ranges and current ranges specific to electrostatic discharges, it is possible to observe the so-called forward-recovery effect resulting in an overvoltage across the terminals of the diode when the latter becomes enabled and which results from the modulation of the conductivity, which overvoltage is all the more significant the faster the rising edge of the incident ESD pulse.

It is also possible to cite the so-called reverse-recovery effect resulting in non-immediate shutdown of the diode with a slowly decreasing voltage and a negative transient current. This reverse recovery is due to the time required to evacuate the diffusion charge of the carriers that were previously stored in the well of the diode.

A compact model of a diode taking into account the modulated resistance (resistance of the well) but also a constant series resistance related to the active regions and to the interconnections, along with the PN junction proper corresponding to the interface between the implantation and the well, has thus been proposed in the aforementioned thesis, and also in the article by Jean-Robert Manouvrier and others entitled "A Physics-base compact model for ESD protection diodes under very fast transients", EOS/ESD symposium 2008.

Such a model makes it possible to conveniently reproduce the forward-recovery effect by simulation.

However, this model does not faithfully reproduce the behavior of the diode in the disabled mode together with the reverse-recovery effect. Indeed, during transient simulations, the decrease in the voltage after the shutdown of the diode takes place in an overly abrupt manner. Thus if this model is coupled with a second compact model, for example a second model of a diode placed in parallel with and in reverse to the first, the second model will be subject to the overly abrupt reverse-recovery of the first diode model. Ultimately, an overvoltage across the terminals of the second diode appears, since the overly abrupt reverse-recovery of the first diode causes a forward-recovery of the second diode which experiences a very sharp rising edge. The simulation result is then erroneous.

According to one mode of implementation, there is proposed a novel compact diode model allowing not only reproduction of the forward-recovery phenomenon, but also faithful reproduction of the reverse-recovery phenomenon and of the behavior of the diode in the disabled mode.

According to one aspect, there is proposed a method for simulating the electrical behavior of an integrated diode in a given situation, the said diode comprising within a well having a first type of conductivity, for example the N type of conductivity, a first active region having a second type of conductivity opposite from the first type, for example a $P^+$-doped region, and at least one second active region having the first type of conductivity, for example an $N^+$-doped region, the said active regions forming the anode and the cathode of the diode, and connections on the active regions; the method comprises a compact modelling of the diode and allowance for this compact modelling in a simulator for the determination of the electrical behavior of the diode in the said given situation, for example in the presence of an ESD pulse; this compact modelling of the diode comprises a modelling of a series resistance relating to the active regions and to the said connections, a modelling of the PN junction of the diode, and a modelling of the well resistance for positive values of the current passing through the diode involving a conductivity modulation model.

According to a general characteristic of this aspect, the compact modelling furthermore comprises a modelling of the well resistance for negative values of the said current, by a curve which increases steeply from an initial resistance value corresponding to a zero value of current, up to a plateau.

The inventor has indeed observed that by acting on the well resistance in the negative current span, it becomes possible at one and the same time to account correctly for the reverse-recovery effect of the diode, so as to avoid the appearance of any artefact during the simulation with the model of the diode, and to better reproduce the real behavior of the diode in the disabled mode.

Furthermore, the inventor has also observed that it was appropriate that the model confer a high value on the well resistance as soon as the current passing through the diode and therefore the well, becomes negative. This is the reason for this steep slope which will allow the well resistance to increase very strongly until it attains the said plateau.

This slope must not be too low, since in this case, the reverse-recovery phenomenon is not correctly modelled.

Thus, by way of nonlimiting example, the plateau can have a value at least equal to twice the said initial resistance value, and the slope may be for example a negative slope at least equal in absolute value to forty times the said initial value per ampere.

It is also possible for example for the value of the plateau to be at least equal to eight times the initial resistance value, and in this case, the slope may be a negative slope at least equal in absolute value to a thousand times the said initial resistance value per ampere.

It is also preferable, although this is not indispensable, that the slope not be too high so as to limit the risk of divergence of the simulation.

Thus, the value of the plateau will preferably be limited to 30 times the initial resistance value and the absolute value of the slope will be limited to 10000 times the initial resistance value per ampere.

According to one mode of implementation, the modelling of the diode comprises the product of a first term, involving the said conductivity modulation model, and of a second term, valid for any value of current, and contributing to the obtaining of the said curve for the negative values of this current, this second term having a quasi-zero influence on the first term for the positive values of the current.

Stated otherwise, with such an approach, this novel compact model does not modify the assets of the former compact model described in the aforementioned thesis and article.

According to one mode of implementation, the first term is equal to $R_{SM0}(1+Qd/Q0)$ where $R_{SM0}$ designates the said initial resistance value of the well, Qd the diffusion charge and Q0 the threshold charge of the well.

The second term then comprises for example a fraction possessing in the numerator a first coefficient and in the denominator a hyperbolic tangent function of the exponential of the product of the current passing through the diode and a second coefficient, the value of the plateau depending on the value of the first coefficient and the value of the slope depending on the value of the second coefficient.

By way of nonlimiting example, the second term is equal to $\frac{1}{2}(1+(2drw+1)/(1+2drw \cdot \tan h(\exp(I \cdot SL))))$ where drw is the first coefficient, tan h designates the hyperbolic tangent function, exp designates the exponential function, SL is the second coefficient, and I designates the current passing through the diode.

The coefficient drw may thus lie for example between 1 and 30, while the coefficient SL is advantageously greater than 30.

According to another aspect, there is proposed a computerized system comprising means configured to implement the method such as defined hereinabove.

According to another aspect, there is also proposed a computer program product directly loadable into a memory of a computerized system, comprising software code portions for the execution of the method such as defined hereinabove, when the said program is executed on the said computerized system.

There is further proposed, according to another aspect, a medium readable by a computerized system, for example a memory, having computer-executable instructions, adapted for bringing about the execution by the computerized system of the method such as defined hereinabove.

In FIG. 1, the reference SINF globally designates a computerized system, for example a computer, comprising means such as a central unit and memory means, configured to implement a mode of implementation of the method of the invention.

According to this mode of implementation illustrated in FIG. 1, input parameters, such as especially geometric parameters of the integrated diode and the value of the doping of the well, are used to determine (10) parameters of the compact model MDC of the diode, such as for example the resistance of the well, the transit time, etc.

Next, the compact model thus parameterized is used in a simulator, for example a simulator of the SPICE type, to perform a simulation 11 of the behavior of the diode in the presence of a given environmental situation, for example an ESD pulse, and to obtain for example the evolution of the voltage V across the terminals of the diode and of the current I passing through it.

The integrated circuit designer will thus be able to evaluate the behavior of the ESD protection diode and optionally modify certain geometric parameters thereof.

Figure 2:
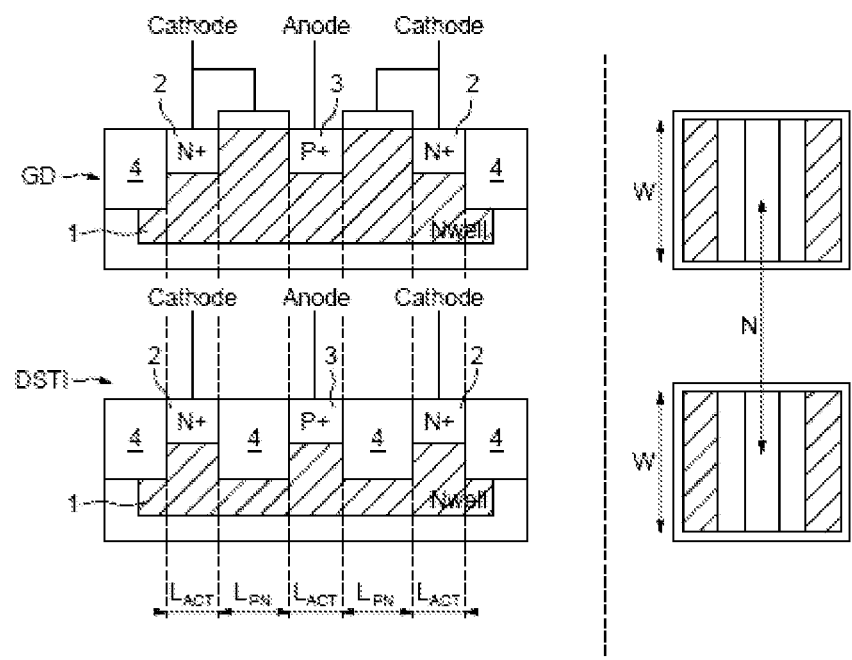
FIG. 2 schematically illustrates two exemplary embodiments of an integrated diode.

Referring now to FIG. 2, it is seen in this exemplary embodiment that an ESD protection diode comprises several distinct parts.

For example, in the case of a P+/Nwell diode there is a well 1 of weakly doped N type (generally designated by the person skilled in the art by the acronym Nwell), a well tap 2 of N type more strongly doped than the well, a strongly doped P+ diffusion 3, situated in the well 1, so as to constitute the P+/Nwell junction, an insulating material 4 between the N+ well tap 2 and the P+ implantation 3 which may be a deep trench filled with oxide (STI, Shallow Trench Isolation).

An STI diode referenced DSTI is then obtained.

Such a diode is illustrated in the bottom part of FIG. 2.

As a variant, the insulating material between the N+ well tap 2 and the P+ implantation may 3 be a weakly doped zone (N well: Nwell) protected from the formation of metallic silicide by virtue of an MOS transistor gate. It is then a field-effect diode or gated diode GD.

Such a gated diode GD is illustrated in the top part of FIG. 2.

A compact model according to the invention can be applied to any type of integrated diode, especially DSTI and GD diodes.

The diode also comprises a peripheral insulation or guard ring, not represented here in these figures, which is used to isolate the diodes from the other structures implanted on the silicon substrate of the integrated circuit.

In the case of a P+/Nwell diode, the intrinsic PN junction is situated at the interface between the P+ implantation 3 and the well Nwell 1. On account of their strong dopings, the P+ and N+ implantations, which constitute respectively the anode and the cathode, make it possible to create a weakly resistive contact between the junction and the interconnection lines. However, the resistor situated between the well tap 2 and the intrinsic junction is not negligible and depends on the resistance of the well 1, the value of which is all the larger the more weakly doped the well 1.

The diode width is denoted W, the spacing between the active zones $L_{PN}$, the length and the number of implantations (here P+) (or of fingers) respectively $L_{ACT}$ and N.

Figure 3:
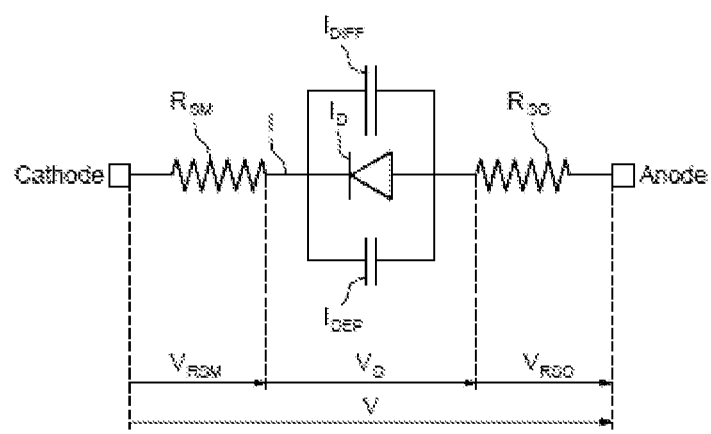
FIG. 3 schematically illustrates an exemplary diode model according to the invention.

The model of the diode comprises three elements (FIG. 3) a constant series resistance $R_{S0}$ related to the active regions (well taps and implantation) and to the interconnections, a modulated resistance $R_{SM}$ which is the resistance of the well, the PN junction corresponding to the interface between the implantation and the well 1. This junction is itself divided into three distinct parts: the intrinsic junction which models the conduction current of the diode, $I_D$, a diffusion capacitance which models the effect of charge storage in the well 1. The current associated with this capacitance is denoted diffusion current $I_{DIFF}$, a depletion capacitance related to the junction's space charge zone.

The current generated by this capacitance is denoted $I_{DEP}$.

These three currents therefore constitute the total current of the diode, denoted I.

Equations of the Model

The current of the intrinsic junction $I_D$ as a function of the voltage across its terminals is given by the Shockley equation.

$$I_D = I_S \left( \exp\left(\frac{V_D}{U_T}\right) - 1 \right) \quad (1)$$

$I_S$ is the saturation current and $U_T$ is the thermodynamic voltage.

The diffusion current $I_{DIFF}$ is defined by the derivative with respect to time of the diffusion charge $Q_D$:

$$I_{DIFF} = \frac{d(Q_D)}{dt} \quad (2)$$

The capacitive current $I_{DEP}$ of the space charge zone is defined by:

$$I_{DEP} = C_j \frac{d(V_D)}{dt} \quad (3)$$

The space charge zone is equivalent to the variable capacitance $C_J$, called the depletion capacitance, modelled by the conventional equation:

$$C_J = C_{J0}\left(1 - \frac{V_D}{VJ}\right)^{-MJ} \quad (4)$$

For $V_D \leq VJ$ $C_{J0}$, VJ and MJ are respectively the junction capacitance for a zero polarization, the junction internal potential and the coefficient of the gradient of the junction (equal to 0.33 for a gradual junction, 0.5 if it is steep). A linear approximation of this formula for a voltage $V_D$ close to VJ makes it possible to circumvent the problems of convergence in the neighbourhood of VJ.

$$C_J = C_{J0}\left(1 - \frac{V_D}{VJ}\right)^{-MJ} \quad (5)$$

For $V_D < FC \cdot VJ$ $$C_J = \frac{C_{J0}}{(1-FC)^{1+MJ}}\left(1 - FC(1+MJ) + MJ \cdot \frac{V_D}{VJ}\right)$$

For $V_D > FC \cdot VJ$

The total voltage across the terminals of the diode, V, is equal to the sum of the potential drops relating to the various parts of the diode. $V_{RSM}$, $V_{RS0}$ and $V_D$ respectively represent the voltages across the terminals of the modulated resistance $R_{SM}$, of the constant resistance $R_{S0}$ and of the intrinsic PN junction. FC is the junction capacitance linearization coefficient. Stated otherwise FC is used for the linear approximation of the formula for a voltage $V_D$ close to VJ. Thus when the voltage nears VJ, fixed by FC.VJ with 0.5<FC<1, the capacitance increases strongly with voltage. The more FC tends to 1 the more the voltage nears VJ and the more the capacitance increases strongly with voltage. In practice it is possible to choose FC=0.9.

As far as the resistance of the well $R_{SM}$ is concerned, it is equal to the product TT1.TT2 of two terms. The first term TT1, valid for positive values of the current passing through the diode, involves a conductivity modulation model.

More precisely, the first term TT1 is equal to $$\frac{R_{SM0}}{1+\frac{Q_D}{Q_0}} \quad (6)$$

$R_{SM0}$, $Q_0$ and $Q_D$ respectively represent the resistance for a zero current, the threshold charge and the diffusion charge of the well responsible for the modulation.

The diffusion charge $Q_D$ is directly related to the transit time, $\tau_T$, of the diode and also to the conduction current of the junction $I_D$:

$$Q_D = \tau_T I_D \quad (7)$$

The determination of the various parameters of the term TT1 defined in (6) will be explained in greater detail hereinafter.

Figure 4:
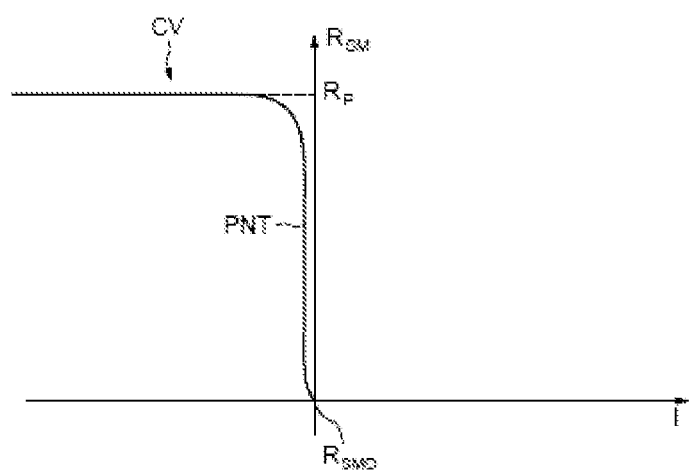
FIG. 4 illustrates a curve representing the evolution of the well resistance for values of negative current.

The second term TT2 makes it possible to model the well resistance $R_{SM}$ for negative values of the current by a curve CV (FIG. 4) which increases steeply from an initial resistance value $R_{SM0}$ corresponding to a zero value of current up to a plateau $R_p$.

The slope PNT of this curve CV must be sufficiently big for the well resistance $R_{SM}$ to attain the plateau $R_p$ very rapidly after the current I passing through the diode has become negative.

By way of indication, when the plateau $R_p$ is equal to twice $R_{SM0}$, this plateau may be attained when I varies between 0 and −25 milliamperes, this corresponding to a slope equal in absolute value to 40 times $R_{SM0}$ per ampere.

That said, it is also possible to have a much greater slope with a much higher plateau value. Thus, provision may be made for a plateau value $R_p$=8 times $R_{SM0}$, which is attained when I varies between 0 and −7 milliamperes, this corresponding to a slope equal to 1000 times $R_{SM0}$ per ampere.

That said, it is preferable, for simulation convergence reasons, not to have too steep a slope. Thus, although not indispensable, a limitation of a slope equal to 10000 times $R_{SM0}$ per ampere will be applied.

In practice, the second term TT2 may be equal to ½(1+(2drw+1)/(1+2drw·tan h(exp(I·SL)))) where drw is a first coefficient on which the value of the plateau $R_p$ depends, tan h designates the hyperbolic tangent function, exp designates the exponential function and SL is a second coefficient on which the value of the slope of the curve depends.

The coefficient drw can lie between 1 and 30, while the coefficient SL, representative of the slope, is preferably greater than 30.

It is noted here that the second term TT2 has a quasi-zero influence on the first term TT1 for the positive values of the current.

Indeed, for positive values of the current, and having regard to the presence of the exponential function, the hyperbolic tangent function tends rapidly to the value 1, thereby rendering the second term TT2 equal to 1.

Although not indispensable for the simulation, it may be beneficial to introduce the coefficient tan h (1) into the second term TT2 so as to regain a value of the well resistance equal to $R_{SM0}$ when the value of the current I is zero. More precisely, in this case, the second term TT2 would be equal to ½(1+(2drw+1)/(1+2drw·tan h(exp(I·SL))/tan h(1)).

As regards degradation in mobility, it is modelled by the Canali model. The mobility μ of the (minority or majority) charge carriers in the well is therefore defined by:

$$\mu = \frac{\mu_0}{1+\frac{\mu_0 \cdot E}{\upsilon_{SAT}}} \quad (8)$$

μ0, $\upsilon_{SAT}$ and E respectively represent the mobility of the charge carriers under a weak electric field, the saturation rate and the electric field.

Determination of the parameters of the model other than those featuring in the term TT2.

The determination of these parameters will now be described. This determination is globally identical to those described in the aforementioned thesis and article to which the person skilled in the art may refer for all useful purposes.

As regards the mobility μ, values of charge carrier saturation rate are indicated in the table herein below.

| Symbol | Electrons | Holes | Unit |
|---|---|---|---|
| $V_{SAT}$ | $1.07^{e+7}$ | $8.7^{e+6}$ | cm/s |

The mobility μ0 of the charge carriers is calculated on the basis of the doping of the well, Nw, according to the Masetti model.

$$\mu_0(N) = \mu_{min1} \cdot \exp\left(-\frac{P_c}{N_w}\right) + \frac{\mu_{const} - \mu_{min2}}{1+\left(\frac{N_w}{C_r}\right)^\alpha} - \frac{\mu_1}{1+\left(\frac{C_s}{N_w}\right)^\beta} \quad (9)$$

The coefficients of the Masetti model for the calculation of the mobility are indicated in the table herein below.

| No | Symbol | Electrons | Holes | Unit |
|---|---|---|---|---|
| 1 | $\mu_{min1}$ | 52.2 | 44.9 | cm²/V · s |
| 2 | $\mu_{min2}$ | 52.2 | 0 | cm²/V · s |
| 3 | $\mu_1$ | 43.4 | 29.0 | cm²/V · s |
| 4 | $P_c$ | 0 | $9.23^{e+16}$ | cm⁻³ |
| 5 | $C_r$ | $9.68^{e+16}$ | $2.23^{e+17}$ | cm⁻³ |
| 6 | $C_s$ | $3.34^{e+20}$ | $6.1^{e+20}$ | cm⁻³ |
| 7 | α | 0.68 | 0.719 | 1 |
| 8 | β | 2 | 2 | 1 |
| 9 | $\mu_{const}$ | 1417 | 470.5 | cm²/V · s |

The electric field in the well is moreover defined by the ratio of the voltage across the terminals of the modulated resistance $V_{RSM}$ to the length of the conduction volume according to the Poisson equation:

$$E = \frac{V_{RSM}}{L} \quad (10)$$

In order to integrate the degradation of the mobility into the model, all the electrical parameters are expressed as a function of the dimensions of the conduction volume.

In order to be able to express the electrical parameters as a function of the geometry of the conduction volume, it is necessary to define the latter. This volume does not take the form of a bar. It is thus difficult to determine the conduction cross-section and the distance travelled by the minority carriers.

The principle is therefore to consider this volume as a bar by using a mean cross-section S and mean distance L.

Figure 5:
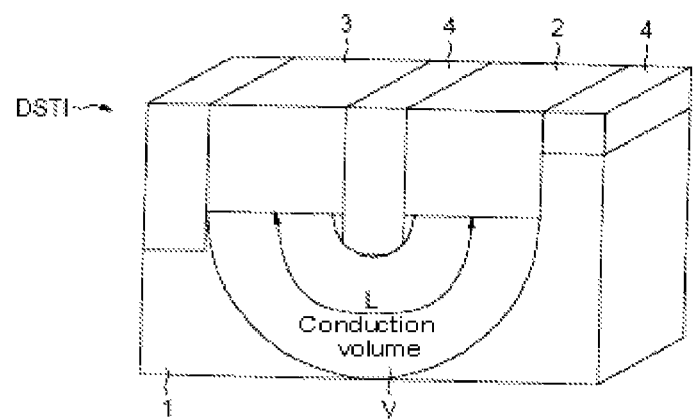
FIGS. 5 and 6 schematically illustrate an exemplary conduction volume of an integrated diode.
Figure 6:
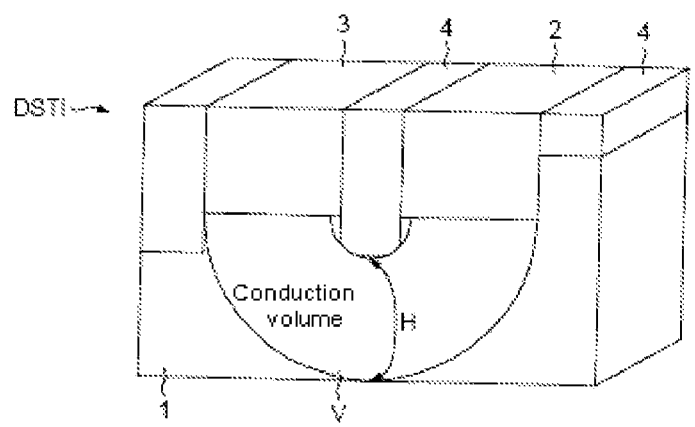

The width W of the conduction volume V is known and equal to the width of the diode. This distance is therefore considered to be a factor applied to the conduction cross-section. It is totally independent of the mean depth H and of the length L of the conduction volume (FIGS. 5 and 6).

A diode possessing N fingers has a total conduction volume equal to 2N elementary conduction volumes (situated between a well tap and a finger). On the basis of these considerations, the cross-section S and the conduction volume V are defined such that:

$$S = 2 \cdot N \cdot W \cdot H \tag{11}$$

$$V = 2 \cdot N \int_0^L \int_0^H \int_0^W dl \cdot dh \cdot dw \approx 2 \cdot N \cdot L \cdot H \cdot W \tag{12}$$

$I_S$ is the junction saturation current. It is defined as a function of the surface area $S_{ACT}$ and of the perimeter $P_{ACT}$ of the implanted active region (P+ in the case of a P+/Nwell diode) by:

$$I_S = J_{SA} \cdot S_{ACT} + J_{SP} \cdot P_{ACT} \tag{13}$$

$J_{SA}$ and $J_{SP}$ are respectively the saturation currents per unit area (in A/µm²) and per unit perimeter (A/µm). The area and the perimeter of a multi-finger diode are defined as a function of the number N of fingers and of the dimensions of each of the diffusions:

$$S_{ACT} = N \cdot L_{ACT} \cdot W \tag{14}$$

$$P_{ACT} = 2 \cdot N(L_{ACT} + W) \tag{15}$$

The modulated resistance $R_{SM0}$ is expressed as a function of the resistivity of the well $\rho_w$, of the cross-section S and of the conduction length L:

$$R_{sm0} = \rho_w \frac{L}{S} \tag{16}$$

This resistivity is calculated on the basis of the mobility of the majority carriers $\mu_{MAJ}$ and the concentration of dopants in the well $N_W$:

$$\rho_w = \frac{1}{q \cdot \mu_{MAJ} \cdot N_w} \tag{17}$$

The threshold charge Q0 is the charge due to the dopants in the conduction volume. The presence of donor atoms (of N type) or acceptor atoms (of P type) causes an excess or a deficit of electrons in relation to the silicon. This charge is therefore calculated by the volume integral of the dopant concentration in the conduction volume:

$$Q_0 = 2 \cdot q \int_0^L \int_0^H \int_0^W n_w(l,h,w) \cdot dl \cdot dh \cdot dw \tag{18}$$

A simplified expression for the threshold charge involving the dimensions of the conduction volume is given by the following equations:

$$Q_0 = q \cdot Nw \cdot V \tag{19}$$

$$V = 2 \cdot N \gamma_q H \cdot W \cdot L \tag{20}$$

The volume being defined by mean dimensions and a mean doping, a shape factor denoted $\gamma_q$ has been introduced. This factor makes it possible to take into account the shape (non-parallelepipedal) of the conduction volume and the doping (non-homogeneous) in the well (doping profile, etc.).

When the volume is likened to a bar and the doping is homogeneous at any point of the volume, this factor is equal to 1.

The transit time is defined generally as the ratio of the stored charge $Q_D$ (diffusion charge) to the conduction current of the junction $I_D$.

The term 'transit' is a loose one since the transit time does not relate to a distance to be travelled but to a volume to be filled. Indeed, it represents the duration required by the minority carriers to occupy the conduction volume. Thus, it is more rigorous to consider it to be the time required to establish the diffusion charge in the well.

In a general manner, having regard to the considerations mentioned hereinabove relating to the distribution of the charges and the conduction volume, the transit time is defined such that:

$$\tau_T = \frac{(L)^2}{N_{TT} \cdot D} \tag{21}$$

where $N_{TT}$ designates the distribution factor for the minority carriers in the well, and D the diffusion constant.

If this distribution is triangular (the diode is said to have a short base) and the conduction cross-section is equal to the active surface area (the diode is a uniform bar), then the distribution factor is equal to 2.

The transit time is then defined simply by:

$$\tau_T = \frac{(L)^2}{2 \cdot D} \tag{22}$$

The diffusion coefficient D is defined by the mobility of the minority carriers in the well, $\mu_{MIN}$, and the thermodynamic voltage, $U_T$, according to the Einstein relation:

$$D = U_T \mu_{MIN} \tag{23}$$

For a weakly doped region like the well, the mobility of the charge carriers has a high value thereby increasing the time required for their diffusion in the well.

The constant part of the diode's own series resistance, $R_{S0}$, is related to the series resistances of the well taps, $R_{TAPS}$, of the implantations, $R_{IMP}$, which are the anodes and the cathodes of the diode and also of the resistance of the metallic interconnections, $R_{METAL}$:

$$R_{S0} = R_{TAPS} + R_{IMP} + R_{METAL} \tag{24}$$

If it is considered that the charge carriers pass vertically through the diffusions towards the contacts, it is possible to define the resistances $R_{TAPS}$ and $R_{IMP}$ such that:

$$R_{TAPS} = \frac{1}{N+1} \rho_{TAPS} \frac{H_J}{W \cdot L_{ACT\_TAPS}}; \tag{25}$$

$$R_{IMP} = \frac{1}{N} \rho_{IMP} \frac{H_J}{W \cdot L_{ACT\_IMP}} \tag{26}$$

Hj the junction depth, $L_{ACT\_TAPS}$ and $L_{ACT\_IMP}$ correspond respectively to the length of the well taps and of the implantations. The resistivities $\rho_{TAPS}$ and $\rho_{IMP}$ are defined by the following equations:

$$\rho_{TAPS} = \frac{1}{q \cdot \mu_{TAPS} \cdot N_{TAPS}}; \tag{26}$$

-continued $$\rho_{IMP} = \frac{1}{q \cdot \mu_{IMP} \cdot N_{IMP}}$$

$\mu_{TAPS}$ and $\mu_{IMP}$ together with $N_{TAPS}$ and $N_{IMP}$ represent respectively the mobility of the majority carriers and the concentration of dopants of the well taps and of the implantations.

The junction capacitance (or depletion capacitance) for a zero polarization is defined as a function of the geometry of the strongly doped zone such that:

$$C_J = C_{J0} \cdot S_{ACT} \quad (27)$$

$C_{J0}$ is the junction capacitance per unit area expressed in f/µm².

Simulation of the Behavior of the Diode

The model of the diode which has just been set forth is thereafter used in the simulator of the SPICE type, for example, which makes it possible to simulate the behavior of the diode during an ESD pulse, for example, so as to obtain the voltage response of the diode as a function of time.

Figure 7:
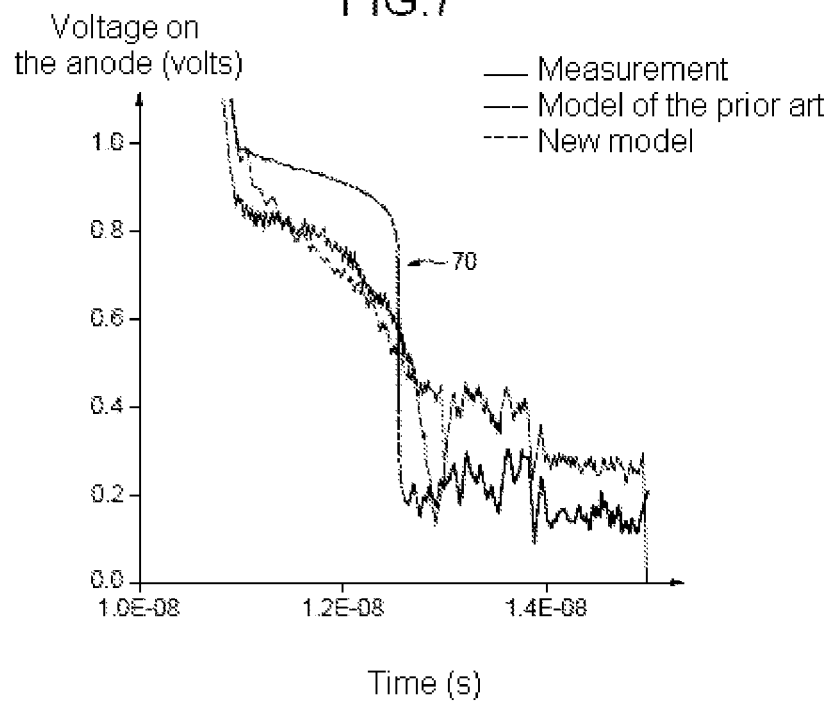
FIG. 7 illustrates a compared evolution of the voltage across the terminals of a gated diode during reverse recovery by using a compact model of the prior art and a model according to the invention.

Thus, whereas the evolution of the voltage as a function of time exhibited during the reverse recovery, as illustrated in FIG. 7, an abrupt decrease 70 when using the model of the prior art, this abrupt decrease is not found when using the model, which has just been described, according to the invention.

Figure 8:
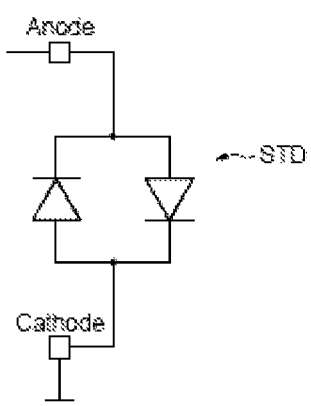
FIG. 8 schematically illustrates an exemplary ESD protection structure using two diodes mounted in anti-parallel fashion.
Figure 9:
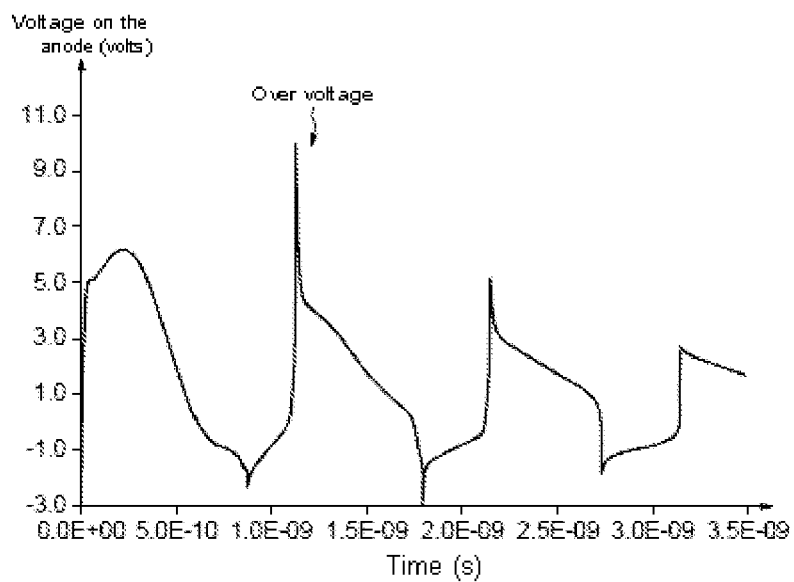
FIGS. 9 and 10 illustrate an evolution of the voltage at the level of the anode node of the structure of FIG. 8 in the presence of an ESD discharge by using a model of the prior state of the art and a model according to the invention.
Figure 10:
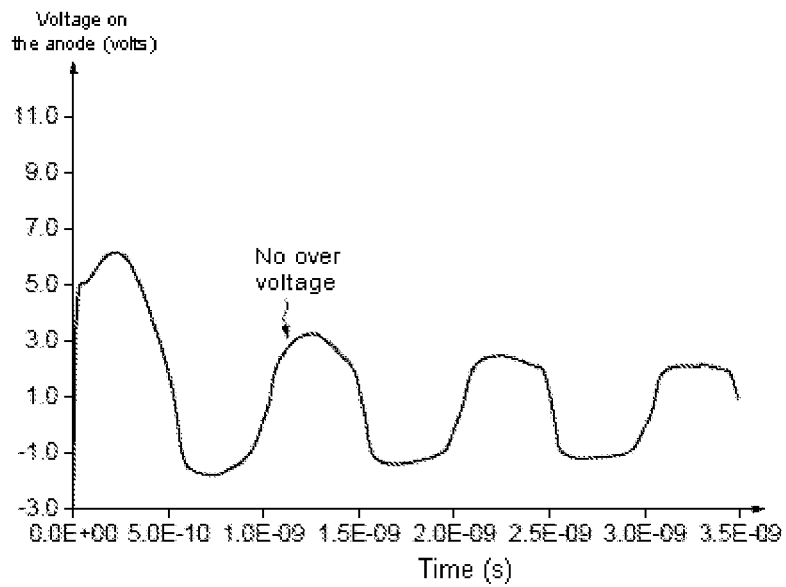

Therefore, whereas the evolution of the voltage over time at the level of the anode node of an STD protection structure using diodes mounted anti-parallel fashion (FIG. 8) and experiencing for example an ESD discharge of the CDM type, exhibited during the simulation using the model of the prior art, as illustrated in FIG. 9, a significant overvoltage not reflecting the real behavior of the diodes, this overvoltage is not found during the simulation when using for each of the two diodes the compact model, which has just been described, according to the invention (FIG. 10).

Figure 11:
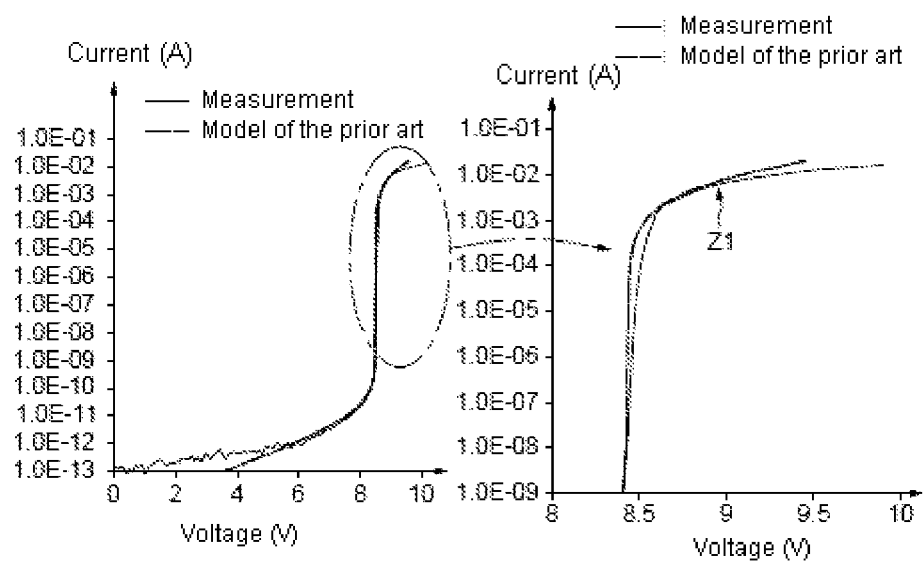
FIGS. 11 and 12 illustrate the evolution of the current as a function of the voltage across the terminals of the diode in the disabled mode, by using a model of the prior art and a model according to the invention.
Figure 12:
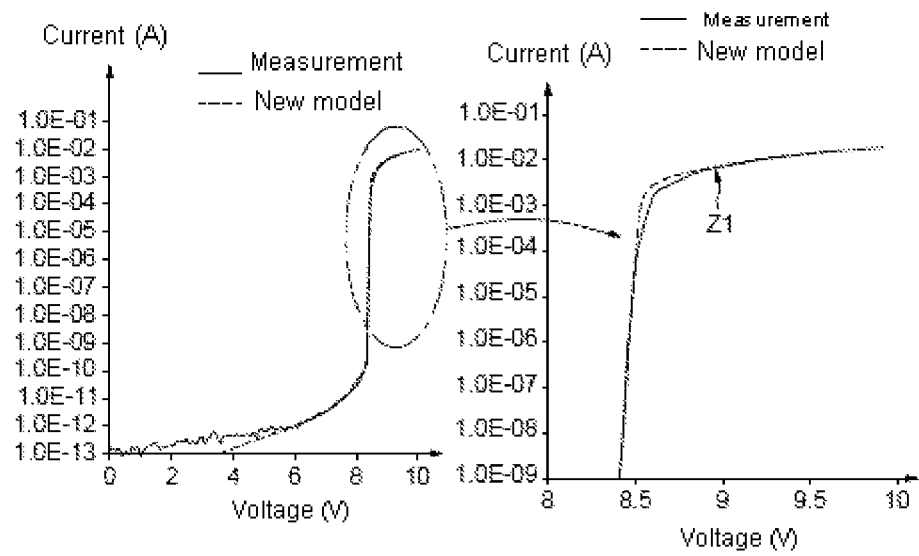

Likewise, whereas with the model of the prior art, a simulated behavior of the diode was obtained which does not correctly reflect the real behavior of the latter in disabled or reverse mode (zone Z1 in FIG. 11), it is seen in FIG. 12 that the model according to the invention allows the simulated behavior of the diode to be made to fit better with the real behavior.

What is claimed is:

1. A method for manufacturing a semiconductor device comprising an integrated diode, the method comprising:
fabricating the integrated diode, the integrated diode comprising a well having a first type of conductivity, a first active region having a second type of conductivity opposite from the first type and at least one second active region having the first type of conductivity, the first and the second active regions forming an anode and a cathode of the diode, and connections on the first and the second active regions;
modelling a compact model of the diode in the electrical device simulator to determine the electrical behavior of the diode in the given situation, the modelling comprising:
modelling a series resistance relating to the active regions and to the connections;
modelling a PN junction of the diode;
modelling a well resistance for positive values of a current passing through the diode using a conductivity modulation model; and
modelling of the well resistance for negative values of the current by a curve which increases from an initial resistance value corresponding to a zero value of current up to a plateau having a constant maximum value.

2. The method according to claim 1, wherein the constant maximum value of the plateau is at least equal to twice the initial resistance value, wherein the well resistance increases from the initial resistance value to the constant maximum value along a slope having a negative slope that is at least equal in absolute value to 40 times the initial resistance value per ampere.

3. The method according to claim 1, wherein the constant maximum value of the plateau is at least equal to 8 times the initial resistance value, wherein the well resistance increases from the initial resistance value to the constant maximum value along a slope having a negative slope that is at least equal in absolute value to 1000 times the initial resistance value per ampere.

4. The method according to claim 1, wherein the modelling a compact model of the diode further comprises determining a product of a first term involving the conductivity modulation model, and of a second term valid for any value of the current, and contributing to obtaining the curve for the negative values of the current, the second term having a quasi-zero influence on the first term for the positive values of the current.

5. The method according to claim 4, wherein the first term is equal to RSM0(1+Qd/Q0) where RSM0 designates the initial resistance value, Qd a diffusion charge and Q0 a threshold charge of the well.

6. The method according to claim 5, wherein the second term comprises a fraction comprising a numerator and a denominator, the numerator having a first coefficient and the denominator comprising a hyperbolic tangent function of an exponential of a product of the current and a second coefficient, wherein the constant maximum value of the plateau depends on the value of the first coefficient and the value of a slope depends on the value of the second coefficient.

7. The method according to claim 6, wherein the second term is equal to ½(1+(2drw+1)/(1+2drw·tan h(exp(I·SL)))) where drw is the first coefficient, tan h designates a hyperbolic tangent function, exp designates an exponential function and SL is the second coefficient, I the current passing through the diode.

8. The method according to claim 7, wherein the coefficient drw lies between 1 and 30.

9. The method according to claim 7, wherein the coefficient SL is greater than 30.

10. A method for designing an integrated circuit (IC) comprising a protection diode by simulating electrical behavior of the protection diode by an electrical device simulator, the method comprising:
receiving parameters describing physical characteristics of the protection diode, the protection diode comprising at least a well having a first type of conductivity, a first active region having a second type of conductivity opposite from the first type and further comprising at least one second active region having the first type of conductivity, the first active region and the second active region forming an anode and a cathode of the diode;
using a modelling tool to model a compact model of the protection diode in the electrical device simulator based on the received parameters, the modelling comprising:

modelling a series resistance relating to the active regions and to a connection on the first active region and a connection on the second active region;

modelling a PN junction of the protection diode;

modelling a well resistance for positive values of a current passing through the diode using a conductivity modulation model; and modelling the well resistance for negative values of the current by a curve which increases from an initial resistance value corresponding to a zero value of current up to a plateau having a constant maximum value, wherein the modelling of the well resistance for positive values of the current using the conductivity modulation model and for negative values of the current using the curve reproduces the current voltage relationship of the protective diode better than obtained by modelling the well resistance only for positive values of the current using the conductivity modulation model; and designing the IC using the modelled protection diode.

11. The method according to claim 10, wherein the constant maximum value of the plateau is at least equal to 8 times the initial resistance value, wherein the well resistance increases from the initial resistance value to the constant maximum value along a slope having a negative slope that is at least equal in absolute value to 1000 times the initial resistance value per ampere.

12. The method according to claim 10, wherein modelling a compact model of the diode further comprises determining a product of a first term involving the conductivity modulation model, and of a second term valid for any value of the current, and contributing to obtaining the curve for the negative values of the current, the second term having a quasi-zero influence on the first term for the positive values of the current, and wherein the first term is equal to RSM0(1+Qd/Q0) where RSM0 designates the initial resistance value, Qd a diffusion charge and Q0 a threshold charge of the well.

13. The method according to claim 12, wherein the second term comprises a fraction comprising a numerator and a denominator, the numerator having a first coefficient and the denominator comprising a hyperbolic tangent function of an exponential of a product of the current and a second coefficient, wherein the constant maximum value of the plateau depends on the value of the first coefficient and the value of a slope depends on the value of the second coefficient.

14. The method according to claim 13, wherein the second term is equal to ½(1+(2drw+1)/(1+2drw·tan h(exp(I·SL)))) where drw is the first coefficient, tan h designates a hyperbolic tangent function, exp designates an exponential function and SL is the second coefficient, I the current passing through the diode.

15. An electrostatic discharge (ESD) protection device modelling tool comprising a processor and a tangible and non-transitory computer readable medium storing a program to be executed by the processor, the program having instructions for designing an integrated circuit comprising a protection diode, the instructions executing steps comprising:

receiving parameters describing physical characteristics of the protection diode, the protection diode comprising at least a well having a first type of conductivity;

modelling, based on the received parameters, a series resistance relating to at least a first active region having a second type of conductivity and at least one second active region having a first type of conductivity opposite the second type of conductivity;

modelling, based on the received parameters, a PN junction of the protection diode;

modelling a well resistance for positive values of a current passing through the protection diode using a conductivity modulation model; and modelling the well resistance for negative values of the current by a curve increasing from an initial resistance value corresponding to a zero value of current up to a plateau having a constant maximum value, wherein the modelling of the well resistance for positive values of the current using the conductivity modulation model and for negative values of the current using the curve reproduces the current voltage relationship of the protective diode better than obtained by modelling the well resistance only for positive values of the current using the conductivity modulation model.

16. The ESD protection device modelling tool according to claim 15, wherein the constant maximum value of the plateau is at least equal to twice the initial resistance value, wherein the well resistance increases from the initial resistance value to the constant maximum value along a slope having a negative slope that is at least equal in absolute value to 40 times the initial resistance value per ampere.

17. The ESD protection device modelling tool according to claim 15, further comprising determining a product of a first term equal to RSM0(1+Qd/Q0) and of a second term valid for any value of the current, the second term having a quasi-zero influence on the first term for positive values of the current, wherein RSM0 designates the initial resistance value, Qd a diffusion charge and Q0 a threshold charge of the well.

18. The ESD protection device modelling tool according to claim 17, wherein the second term comprises a fraction comprising a numerator and a denominator, the numerator having a first coefficient and the denominator comprising a hyperbolic tangent function of an exponential of a product of the current and a second coefficient, wherein the constant maximum value of the plateau depends on the value of the first coefficient and the value of a slope depends on the value of the second coefficient.

19. The ESD protection device modelling tool according to claim 18, wherein the second term is equal to ½(1+(2drw+1)/(1+2drw·tan h(exp(I·SL)))) where drw is the first coefficient, tan h designates a hyperbolic tangent function, exp designates an exponential function and SL is the second coefficient, I the current passing through the diode.

20. The ESD protection device modelling tool according to claim 15, wherein the parameters describing physical characteristics of the diode comprise at least geometric parameters of the diode and a value of a doping of the well.

* * * * *